(12) United States Patent
Feng

(10) Patent No.: US 10,170,032 B2
(45) Date of Patent: Jan. 1, 2019

(54) GATE DRIVE CIRCUIT UNIT AND DRIVING METHOD THEREOF, GATE DRIVE CIRCUIT, AND DISPLAY DEVICE

(71) Applicants: BOE TECHNOLOGY GROUP CO., LTD., Beijing (CN); HEFEI BOE OPTOELECTRONICS TECHNOLOGY CO., LTD., Anhui (CN)

(72) Inventor: Silin Feng, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/713,505

(22) Filed: Sep. 22, 2017

(65) Prior Publication Data

US 2018/0240394 A1    Aug. 23, 2018

(30) Foreign Application Priority Data

Feb. 23, 2017 (CN) .......................... 2017 1 0099558

(51) Int. Cl.
*G09G 3/36* (2006.01)
*G11C 19/28* (2006.01)
*G09G 3/20* (2006.01)

(52) U.S. Cl.
CPC ... *G09G 3/2092* (2013.01); *G09G 2300/0852* (2013.01); *G09G 2300/0871* (2013.01); *G09G 2310/0289* (2013.01); *G09G 2310/08* (2013.01)

(58) Field of Classification Search
CPC ......... G09G 3/2092; G09G 2300/0852; G09G 2300/0871; G09G 2310/0289; G09G 2310/08; G09G 3/3688; G09G 2300/0426; G09G 2310/0286; G09G 2300/0408; G09G 3/36
See application file for complete search history.

(56) References Cited

U.S. PATENT DOCUMENTS

| | | | |
|---|---|---|---|
| 2008/0055225 A1* | 3/2008 | Pak ...................... | G09G 3/3677 345/96 |
| 2009/0040203 A1* | 2/2009 | Kim ..................... | G09G 3/3677 345/204 |
| 2016/0358666 A1* | 12/2016 | Pang .................... | G11C 19/287 |
| 2017/0323609 A1* | 11/2017 | Zhao .................... | G09G 3/3677 |

* cited by examiner

*Primary Examiner* — Md Saiful A Siddiqui
(74) *Attorney, Agent, or Firm* — McDermott Will & Emery LLP

(57) ABSTRACT

A gate drive circuit unit includes an input sub-circuit for pulling a voltage at a first node as the same as a voltage at a first level terminal, a control sub-circuit for pulling a voltage at a second node as the same as a voltage of the first level terminal, or pulling a voltage at a second node as the same as a voltage of a second level terminal, an energy storage sub-circuit for storing a voltage at the first node, a reset sub-circuit for pulling the voltage at the first node as the same as the voltage at the second level terminal and pulling the voltage at the signal output terminal as the same as the voltage at the second level terminal, and an output sub-circuit for outputting a second clock signal of a second clock signal terminal at the signal output terminal.

12 Claims, 7 Drawing Sheets

| at the first phase, the input sub-circuit pulls the voltage at the first node as the same as the voltage at the first level terminal under the control of the input signal at the signal input terminal, and the control sub-circuit pulls the voltage at the second node as the same as the voltage at the second level terminal under the control of the input signal at the signal input terminal and the output signal at the signal output terminal | — S1 |

↓

| at the second phase, the output sub-circuit outputs the second clock signal at the second clock signal terminal at the signal output terminal under the control of the voltage at the first node; and the control sub-circuit pulls the voltage at the second node as the same as the voltage at the second level terminal under the control of the input signal at the signal input terminal and the output signal at the signal output terminal; the energy storage sub-circuit causes the voltage at the first node and the voltage at the signal output terminal to happen the equipotential jump | — S2 |

↓

| at the third phase, the control sub-circuit pulls the voltage at the second node as the same as the voltage at the first level terminal under the control of the first clock signal of the first clock signal terminal, the input signal at the signal input terminal and the output signal at the signal output terminal; and the reset sub-circuit pulls the voltage at the first node as the same as the voltage at the second level terminal and pulls the voltage at the signal output terminal as the same as the voltage at the second level terminal, under the control of the voltage at the second node | — S3 |

GATE DRIVE CIRCUIT UNIT AND DRIVING METHOD THEREOF, GATE DRIVE CIRCUIT, AND DISPLAY DEVICE

CROSS-REFERENCE TO RELATED APPLICATION

This application claims benefit and priority to Chinese Patent Application No. 201710099558.3, filed on Feb. 23, 2017, titled "GATE DRIVING UNIT AND DRIVING METHOD THEREOF, GATE DRIVE CIRCUIT, AND DISPLAY DEVICE", which is incorporated herein by reference in its entirety.

TECHNICAL FIELD

The present disclosure relates to a display technology, more particularly, to a gate drive circuit unit and a driving method thereof, a gate drive circuit, and a display device.

BACKGROUND

With the continuous development of display technology, the display has been widely used by various electronic devices gradually, such as mobile phones, personal digital assistants (PDA), digital cameras, computer screens or notebook computers.

In recent years, the development trend of high integration and low cost has appeared in the development of the display. One of the very important technologies is the realization of the mass production of GOA (Gate Driver on Array) technology. The gate drive circuit is integrated into the array substrate of the display panel using the GOA technique, so that the gate drive integrated circuit portion can be omitted to reduce the product cost from both material cost and fabrication process. Such a gate switching circuit integrated in the array substrate by using GOA technology is also known as the gate drive circuit or shift register circuit.

SUMMARY

An embodiment of the present disclosure provides a gate drive circuit unit and a driving method thereof, a gate drive circuit and a display device, which are capable of reducing the influence between the upper stage and lower stage gate drive circuit units and enhancing the fault tolerance of a gate drive circuit.

In order to achieve this objective, the embodiments of the present disclosure adopt the following technical solutions.

A first aspect of the disclosure provides a gate drive circuit unit, which includes an input sub-circuit, a control sub-circuit, an energy storage sub-circuit, a reset sub-circuit, and an output sub-circuit.

The input sub-circuit is connected to a first level terminal, a signal input terminal and a first node, and used for pulling a voltage at the first node as the same as a voltage at the first level terminal under the control of an input signal at the signal input terminal.

The control sub-circuit is connected to the first level terminal, a second level terminal, a first clock signal terminal, a signal output terminal and a second node, and used for pulling a voltage at the second node as the same as a voltage at the first level terminal under the control of a first clock signal at the first clock signal terminal, an input signal at the signal input terminal and an output signal at the signal output terminal, or pulling a voltage at the second node as the same as a voltage at the second node under the control of an input signal at the signal input terminal and an output signal at the signal output terminal.

The energy storage sub-circuit is connected to the first node and the signal output terminal, and used for storing the voltage at the first node and causing the voltage at the first node and the voltage at the signal output terminal to equi-potentially jump.

The reset node circuit is connected to the signal output terminal, the first node, the second node and the second level terminal, and used for pulling the voltage at the first node as the same as the voltage at the second level terminal and pulling the voltage at the signal output terminal as the same as the voltage at the second level terminal under the control of the voltage at the second node.

The output sub-circuit is connected to the first node, the signal output terminal, and a second clock signal terminal, and used for outputting a second clock signal of a second clock signal terminal at the signal output terminal under the control of the voltage at the first node.

According to the first aspect of the disclosure, the input sub-circuit includes a first transistor and a second transistor.

A first end of the first transistor and gate of the first transistor are connected to the first level terminal, and a second end of the first transistor is connected to a first end of the second transistor.

A second end of the second transistor is connected to the first node, and gate of the second transistor is connected to the signal input terminal.

According to the first aspect of the disclosure, the control sub-circuit includes a third transistor, a fourth transistor, a fifth transistor, and a first capacitor.

A first end of the third transistor is connected to the first level terminal, a second end of the third transistor is connected to the second node, and a gate of the third transistor is connected to the first clock signal terminal.

A first end of the fourth transistor is connected to the second node, a second end of the fourth transistor is connected to the second level terminal, and a gate of the fourth transistor is connected to the signal output terminal.

A first end of the fifth transistor is connected to the second node, a second end of the fifth transistor is connected to the second level terminal, and a gate of the fifth transistor is connected to the signal output terminal.

A first end of the first capacitor is connected to the second node, and a second end of the first capacitor is connected to the second level terminal.

According to the first aspect of the disclosure, the energy storage sub-circuit includes a second capacitor.

A first pole of the second capacitor is connected to the first node, and a second pole of the second capacitor is connected to the signal output terminal.

According to the first aspect of the disclosure, the reset sub-circuit includes a sixth transistor.

A first end of the sixth transistor is connected to the first node, a second end of the sixth transistor is connected to the second level terminal, and a gate of the sixth transistor is connected to the second node.

A seventh transistor, a first end of the seventh transistor is connected to the signal output terminal, a second end of the seventh transistor is connected to the second level terminal, and a gate of the seventh transistor is connected to the second node.

According to the first aspect of the disclosure, the output sub-circuit includes an eighth transistor.

A first end of the eighth transistor is connected to the second clock signal terminal, a second end of the eighth transistor is connected to the signal output terminal, and a gate of the eighth transistor is connected to the first node.

According to the first aspect of the disclosure, the output sub-circuit further includes a ninth transistor.

A first end of the ninth transistor is connected to the second clock signal terminal, a second end of the ninth transistor and a gate of the ninth transistor are connected to the signal output terminal.

According to the first aspect of the disclosure, both the first transistor and the second transistor are N-type transistors or both P-type transistors.

A second aspect of the disclosure provides a driving method of a gate drive circuit unit for driving the gate drive circuit unit according to the first aspect, the method including: a first phase, at which an input sub-circuit pulls a voltage at a first node as the same as a voltage at a first level terminal under the control of an input signal at a signal input terminal, and a control sub-circuit pulls a voltage at a second node as the same as a voltage at a second level terminal under the control of the input signal at the signal input terminal and an output signal at a signal output terminal; a second phase, at which an output sub-circuit outputs a second clock signal of a second clock signal terminal at the signal output terminal under the control of the voltage at the first node; the control sub-circuit pulls the voltage at the second node as the same as the voltage at the second level terminal under the control of the input signal at the signal input terminal and the output signal at the signal output terminal; and an energy storage sub-circuit causes the voltage at the first node and the voltage at the signal output terminal to equipotentially jump; a third phase, at which the control sub-circuit pulls a voltage at the second node as the same as a voltage at the first level terminal under the control of a first clock signal at the first clock signal terminal, an input signal at the signal input terminal and an output signal at the signal output terminal; and a reset sub-circuit pulls the voltage at the first node as the same as the voltage at the second level terminal and pulls the voltage at the signal output terminal as the same as the voltage at the second level terminal under the control of the voltage at the second node.

A third aspect of the disclosure provides a gate drive circuit, which includes at least two cascaded gate drive circuit units according to the first aspect.

A signal input terminal of a first stage gate drive circuit unit is connected to a frame start signal terminal STV, and a signal output terminal of the first stage gate drive circuit unit is connected to a signal input terminal of a second stage gate drive circuit unit.

A signal input terminal of an n-th stage gate drive circuit unit is connected to a signal output terminal of an (n−1)-th stage gate drive circuit unit, and a signal output terminal of the n-th stage gate drive circuit unit is connected to a signal input terminal of an (n+1)-th stage gate drive circuit unit.

Herein, n is an integer greater than 1.

According to the third aspect of the disclosure, the at least two cascaded gate drive circuit units include gate drive circuit units from a first stage to an m-th stage, where m is an integer greater than or equal to n. A signal input terminal of an m-th stage gate drive circuit unit is connected to a signal output terminal of an (m−1)-th stage gate drive circuit unit, and a signal output terminal of the m-th stage gate drive circuit unit is connected to a signal input terminal of the first stage gate drive circuit unit.

A fourth aspect of the disclosure provides a display device, which includes a gate drive circuit according to the third aspect.

The gate drive circuit unit provided by the embodiments of this disclosure can make the gate drive circuit unit of the present stage realize its self-resetting without the output of the gate drive circuit unit of the next stage. The influence between the upper stage and lower stage gate drive circuit units is reduced and the fault tolerance of the gate drive circuit is improved.

BRIEF DESCRIPTION OF THE DRAWINGS

In order to describe technical solutions in embodiments of the present disclosure or in the prior art more clearly, the accompanying drawings to be used in the description of embodiments or the prior art will be introduced briefly. Obviously, the accompanying drawings to be described below are merely some embodiments of the present disclosure, and a person of ordinary skill in the art can obtain other drawings according to those drawings without paying any creative effort.

FIG. 4 is a step flow diagram of the driving method of gate drive circuit unit provided by an embodiment of the present disclosure;

DETAILED DESCRIPTION

Figure 1:
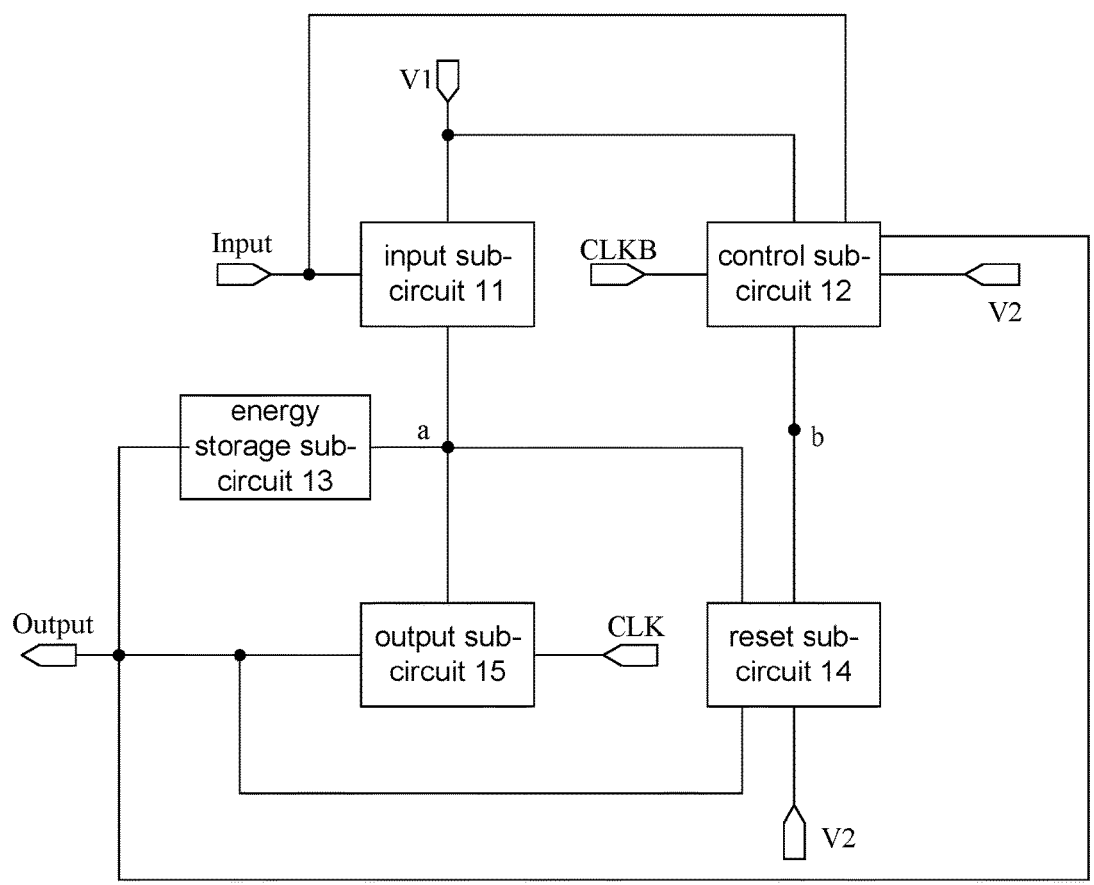
FIG. 1 is a schematic structure diagram of gate drive circuit unit provided by an embodiment of the present disclosure.

The gate drive circuit unit and the driving method thereof, the gate drive circuit, and the display device provided by the embodiments of the present disclosure will be described below in detail with reference to the accompanying drawings, wherein like reference numbers identify like elements herein. In the following description, for purposes of explanation, numerous specific details are set forth, in order to provide a thorough understanding of one or more embodiments. However, obviously, the embodiments may be implemented without these specific details. In other instances, well-known structures and devices are shown in block diagram form to facilitate the description of one or more embodiments.

The switching transistor and the driving transistor used in all embodiments of the present disclosure may be thin film transistors or field-effect transistors or other devices having the same characteristics. Since the source and the drain of the switching transistor employed here is symmetrical, its source and drain are interchangeable. So, the source and the drain can also be called the first end and the second end. In the embodiments of the present disclosure, one end of the transistor is called a source, and the other end of that is called a drain. For example, as described below, the first end of each of the transistors may be a source, and the second end of that is a drain. According to the form shown in the figure, the middle end of the switching transistor is the gate, the signal input is the drain, and the output is the source. The switching transistor used in the embodiments of the present disclosure includes two types of P-type switching transistor and N-type switching transistor, wherein the P-type switching transistor is turned on when the gate is at a low level and turned off when the gate is at a high level, and the N-type switching transistor is turned on when the gate is at a high level and is turned off when the gate is at a low level.

In some examples, the gate drive circuit may be cascaded by a plurality of gate drive circuit units. Currently, most of the gate drive circuits are based on a conventional 4T1C circuit, and in such gate drive circuits, the output of the gate drive circuit unit of the preceding stage is used as the trigger signal of the gate drive circuit unit of this stage, and the output of the drive circuit unit of the next stage is used as the reset signal of the gate drive circuit unit of this stage, thus, the output of the drive circuit unit of the next stage is required to achieve the reset of the gate drive circuit unit of this stage. As a result, the gate drive circuit units of the upper and lower stages have a strong correlation, so that the output of the gate drive circuit unit of this stage can be affected when a failure happens on the output of the gate drive circuit unit of the next stage. That is, in the partial embodiment of the present disclosure, the gate drive circuit units of the upper and lower stages influence each other, making it difficult to improve the fault tolerance of the gate drive circuit.

Figure 5:
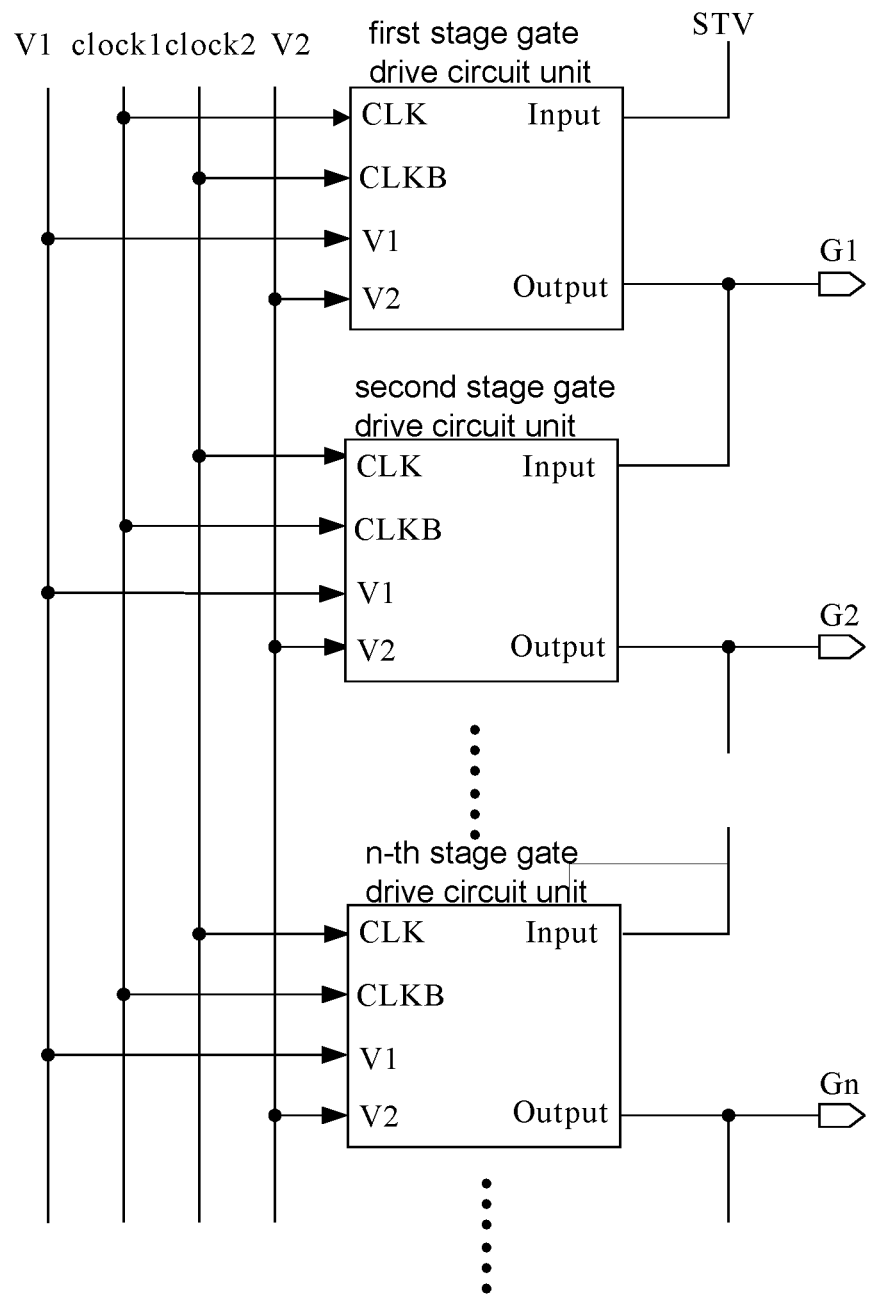
FIG. 5 is a schematic block diagram of gate drive circuit provided by an embodiment of the present disclosure.

Based on this, an embodiment of the present disclosure provide another gate drive circuit that can reduce the influence of the upper and lower stage gate drive circuit units, thereby enhancing the fault tolerance of the gate drive circuit. As shown in FIG. 5, the other gate drive circuit includes at least two cascaded gate drive circuit units. For ease of understanding, the construction and function of the gate drive circuit unit will be described first below.

The gate drive circuit unit, as shown in FIG. 1, includes an input sub-circuit 11, a control sub-circuit 12, an energy storage sub-circuit 13, a reset sub-circuit 14, and an output sub-circuit 15.

The input sub-circuit 11 is connected to a first level terminal V1, a signal input terminal Input, and a first node a. The input sub-circuit 11 is used for pulling the voltage at the first node a as the same as the voltage at the first level terminal V1 under the control of an input signal at the signal input terminal Input.

The control sub-circuit 12 is connected to the first level terminal V1, a second level terminal V2, a first clock signal CLKB, a signal output terminal Output, and a second node b. The control sub-circuit 12 is used for, pulling the voltage at the second node b as the same as the voltage at the first level terminal V1 under the control of a first clock signal at the first clock signal CLKB, an input signal at the signal input terminal Input and an output signal at the signal output terminal Output, or, pulling the voltage at the second node b as the same as the voltage at the second level terminal V2 under the control of an input signal at the signal input terminal Input and an output signal at the signal output terminal Output.

The energy storage sub-circuit 13 is connected to the first node a and the signal output terminal Output. The energy storage sub-circuit 13 is used for storing the voltage at the first node a and causing the voltage at the first node a and the voltage at the signal output terminal Output to equipotentially jump.

The reset sub-circuit 14 is connected to the signal output terminal Output, the first node a, the second node b, and the second level terminal V2. The reset sub-circuit 14 is used for pulling the voltage at the first node a as the same as the voltage at the second voltage terminal V2 and pulling the voltage at the signal output terminal Output as the same as the voltage at the second voltage terminal V2 under the control of the voltage at the second node b.

The output sub-circuit 15 is connected to the first node a, the signal output terminal Output, and a second clock signal terminal CLK. The output sub-circuit 15 is used for outputting a second clock signal at the second clock signal terminal CLK at the signal output terminal Output under the control of the voltage at the first node a.

The gate drive circuit unit provided by the embodiment of the present disclosure can make the gate drive circuit unit of the present stage realize its self-resetting without the output of the gate drive circuit unit of the next stage, and reduce the influence between the gate drive circuit units of the upper and lower stage, thereby enhancing the fault tolerance of the gate drive circuit.

Figure 2:
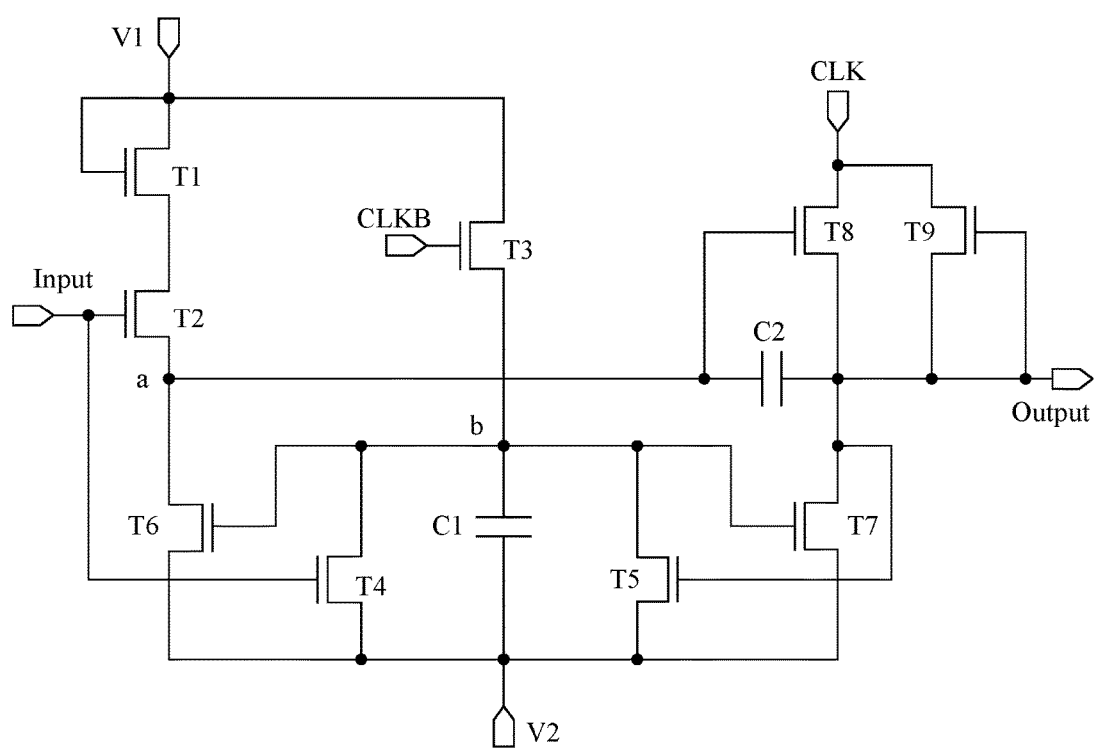
FIG. 2 is a circuit diagram of gate drive circuit unit provided by an embodiment of the present disclosure.

Further, as shown in FIG. 2, the input sub-circuit 11 above includes a first transistor T1 and a second transistor T2.

The first terminal of the first transistor T1 and the gate of the first transistor T1 are both connected to the first level terminal V1, and the second terminal of the first transistor T1 is connected to the first terminal of the second transistor T2.

The second terminal of the second transistor T2 is connected to the first node a and the gate of the second transistor T2 is connected to the signal input terminal Input.

The control sub-circuit 12 includes a third transistor T3, a fourth transistor T4, a fifth transistor T5, and a first capacitor C1.

The first terminal of the third transistor T3 is connected to the first level terminal V1, the second terminal of the third transistor T3 is connected to the second node b, and the gate of the third transistor T3 is connected to the first clock signal terminal CLKB.

The first terminal of the fourth transistor T4 is connected to the second node b, the second terminal of the fourth transistor T4 is connected to the second level terminal V2, and the gate of the fourth transistor T4 is connected to the signal input terminal Input.

The first terminal of the fifth transistor T5 is connected to the second node b, the second terminal of the fifth transistor T5 is connected to the second level terminal V2, and the gate of the fifth transistor T5 is connected to the signal output terminal Output.

The first terminal of the first capacitor C1 is connected to the second node b, and the second terminal of the first capacitor C1 is connected to the second level terminal V2.

The energy storage sub-circuit 13 above includes a second capacitor C2.

The first pole of the second capacitor C2 is connected to the first node a, and the second pole of the second capacitor C2 is connected to the signal output terminal Output.

The reset sub-circuit 14 above includes a sixth transistor T6 and a seventh transistor T7.

The first terminal of the sixth transistor T6 is connected to the first node a, the second terminal of the sixth transistor T6 is connected to the second level terminal V2, and the gate of the sixth transistor T6 is connected to the second node b.

The first terminal of the seventh transistor T7 is connected to the signal output terminal Output, the second terminal of the seventh transistor T7 is connected to the second level terminal V2, and the gate of the seventh transistor T7 is connected to the second node b.

The output sub-circuit 15 above includes an eighth transistor T8.

The first terminal of the eighth transistor T8 is connected to the second clock signal terminal CLK, the second terminal connection signal output terminal Output of the eighth transistor T8, and the gate of the eighth transistor T8 is connected to the first node a.

Optionally, the output sub-circuit 15 above further comprises a ninth transistor T9.

The first terminal of the ninth transistor T9 is connected to the second clock signal terminal CLK, the second terminal of the ninth transistor T9 and the gate of the ninth transistor T9 are both connected to the signal output terminal Output.

The ninth transistor T9 can be turned on by the ninth transistor T9 when the signal output terminal Output outputs the high level signal, thereby enhancing the output drive capability of the gate drive circuit unit of the present stage.

It should note that, each of the transistors in the embodiment of the present disclosure is an N-type transistor, or each of the transistors is a P-type transistor.

Figure 3:
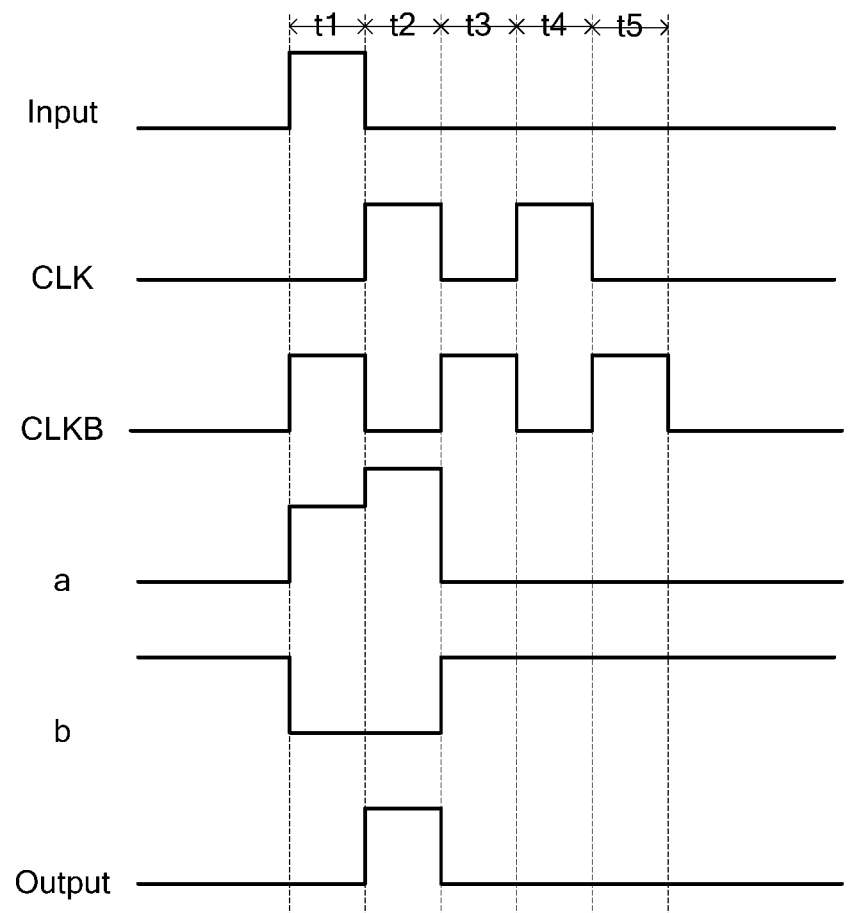
FIG. 3 is a timing diagram of the signals of gate drive circuit units in the display state provided by an embodiment of the present disclosure.

In another embodiment of the present disclosure, there is provided a driving method of a gate drive circuit unit, and this driving method is used to drive a gate drive circuit unit in the above embodiment for display. Referring to FIG. 3, shown as a schematic timing state diagram at the display phase, wherein all the switching transistors in FIG. 2 are N-type transistors of being high-level turned on as an example. Timing states of output signal at, the input signal at the signal input terminal Input, the first clock signal of the first clock signal terminal CLKB, the second clock signal at the second clock signal terminal CLK, the voltage at the first node a, the voltage at the second node b, and the output signal at the signal output terminal Output, are included in FIG. 3. Wherein, the first level terminal V1 and the second level terminal V2 provide the voltage stability at the display phase. Illustratively, the voltage at the first level terminal V1 may be 12V, the voltage at the second level terminal V2 may be 0V, also the second level terminal V2 may be grounded. As shown in FIG. 3, the display phase includes five timing states, including: a first phase t1, a second phase t2, a third phase t3, a fourth phase t4, and a fifth phase t5.

Further, reference may be made to FIG. 4, which is shown as a step flow chart of the driving method of gate drive circuit unit provided by the embodiment of the present disclosure.

S1, at the first phase, the input sub-circuit pulls the voltage at the first node as the same as the voltage at the first level terminal under the control of the input signal at the signal input terminal; the control sub-circuit pulls the voltage at the second node as the same as the voltage at the second level terminal under the control of the input signal at the signal input terminal and the output signal at the signal output terminal.

Specially, at the first phase t1, the input signal at the signal input terminal Input and the first clock signal of the first clock signal CLKB are both high level, thus, the first transistor T1, the second transistor T2, the third transistor T3, The fourth transistor T4 are turned on. The first capacitor C1 is discharged through the fourth transistor T4 by setting the size ratio of the third transistor T3 and the fourth transistor T4, so that the second node b is at a low level. Since the second node b is at a low level, the sixth transistor T6 and the seventh transistor T7 are turned off to ensure that the gate drive circuit unit normally outputs. The first transistor T1 and the second transistor T2 are turned on, thus the second capacitor C2 is charged so that the first node a is at a high level, then the fifth transistor T8 is turned on. In turn, since the second clock signal at the second clock signal CLK is low level, the signal output terminal Output outputs a low level, so that the fifth transistor T5 is turned off. This phase is also referred to as precharge phase.

S2, at the second phase, the output sub-circuit outputs the second clock signal at the second clock signal terminal at the signal output terminal under the control of the voltage at the first node; and the control sub-circuit pulls the voltage at the second node as the same as the voltage at the second level terminal under the control of the input signal at the signal input terminal and the output signal at the signal output terminal; the energy storage sub-circuit causes the voltage at the first node and the voltage at the signal output terminal to equipotentially jump.

Specially, at the second phase t2, the input signal at the signal input terminal Input and the first clock signal of the first clock signal CLKB are both low level, thus, the first transistor T1, the second transistor T2, the third transistor T3 and the fourth transistor T4 are turned off. The a-point potential is further pulled up due to the bootstrap effect of the second capacitor C2, so that the eighth transistor T8 is sufficiently turned on. The third transistor T3 is turned off, thus, the second node b is at a low level, and the sixth transistor T6 and the seventh transistor T7 are turned off to ensure that the gate drive circuit unit normally outputs. In turn, since the second clock signal at the second clock signal CLK is high level and the eighth transistor T8 is turned on, thus, the signal output terminal Output outputs the second clock signal at the second clock signal CLK. Since the signal output terminal Output outputs high level, the fifth transistor T5 is turned on to further ensure that the second node b is at a low level. This phase is also referred to as the output phase.

It should note that, when the output signal at the signal output terminal Output is high level, the fifth transistor T5 is turned on, to further ensure that the second node b is at a low level, while, the ninth transistor T9 is turned on, to enhance the output drive capability of the gate drive circuit unit.

S3, at the third phase, the control sub-circuit pulls the voltage at the second node as the same as the voltage at the first level terminal under the control of the first clock signal of the first clock signal terminal, the input signal at the signal input terminal and the output signal at the signal output terminal; and the reset sub-circuit pulls the voltage at the first node as the same as the voltage at the second level terminal and pulls the voltage at the signal output terminal as the same as the voltage at the second level terminal, under the control of the voltage at the second node.

Specially, at the third phase t3, the input signal at the signal input terminal Input and the second clock signal at the second clock signal terminal CLK are both low level and the first clock signal of the first clock signal terminal CLKB is high level, thus, The third transistor T3 is turned on, and, the second transistor T2, the fourth transistor T4, the fifth transistor T5, the eighth transistor T8 and the ninth transistor T9 are turned off, so that the potential of the second node b rises while the first capacitor C1 is charged through the third transistor T3. The potential of the second node b rises to a high level, thus the sixth transistor T6 and the seventh transistor T7 are turned on, and the potentials of the output signal at the first node a and the signal output terminal Output are pulled and kept at a low level, so the first node a and the signal output terminal Output at this phase are reset. This phase is also referred to as the reset phase.

Further, referring to FIG. 3, at the fourth phase t4 and the fifth phase t5, the second node b is kept at a high level due to the action of the first capacitor C1, thus the output signals of the first node a and the signal output terminal Output are low level, so that the signal input terminal Input is also at a low level. The first clock signal of the first clock signal terminal CLKB and the second clock signal at the second clock signal terminal CLK are kept in opposite phase, and provide the gate drive circuit unit with the clock signal.

Furthermore, all of the transistors in the gate drive circuit unit in the above embodiment may also be low-level conduction P-type transistors. If all of the transistors are P-type transistors, it is only necessary to readjust the timing state of each signal of the gate drive circuit unit. For example, the clock signal of the clock signal terminal in FIG. 3 is adjusted to the opposite phase, and the other signals are also adjusted to the phase-reversed timing signals. The N-type and P-type transistors may be used at the same time in the gate drive circuit unit. In this case, it is necessary to ensure that the transistors through the same timing signal or voltage control need to be of the same type in the gate drive circuit unit. Of course these are reasonable alternatives that can be made by one person skilled in the art in accordance with embodiments of the present disclosure, and therefore should be within the scope of the present disclosure. However, in view of the process of the transistor process, since the active layer doping materials of the different types of transistors are different, the use of a unified type of transistor in the inverter is more conducive to the process of the gate drive circuit unit.

From the driving method of the gate drive circuit unit provided by the embodiment of the present embodiment, the gate drive circuit unit can be used to realize the self-resetting of the gate drive circuit unit of the present stage without the output of the gate drive circuit unit of the next stage, thereby reducing the interaction between the upper and lower stages of the gate drive circuit units, and enhancing the fault tolerance of the gate drive circuit.

On the basis of the gate drive circuit unit and the driving method thereof in the embodiment of the present embodiment described above, the gate drive circuit provided by still another embodiment of this disclosure is described below. Referring to FIG. 5, the gate drive circuit comprises at least two cascaded gate drive circuit units.

The signal input terminal of the first stage gate drive circuit unit is connected to the frame start signal terminal STV, and the signal output terminal of the first stage gate drive circuit unit is connected to the signal input terminal of the second stage gate drive circuit unit.

The signal input terminal of the n-th stage gate drive circuit unit is connected to the signal output terminal of the (n−1)-th stage gate drive circuit unit, and the signal output terminal of the n-th stage gate drive circuit unit is connected to the signal input terminal of the (n+1)-th stage gate drive circuit unit.

The sign "n" is an integer greater than 1.

Specifically, referring to FIG. 5, the gate drive circuit includes a plurality of cascaded gate drive circuit units, wherein the signal input terminal Input of the first stage gate drive circuit unit is connected to the frame start signal terminal STV, The signal output terminal Output of the first stage gate drive circuit unit is connected to the signal input terminal of the second stage gate drive circuit unit and the gate line G1, and the signal output terminal of the second stage gate drive circuit unit is connected to the signal input terminal of the third stage gate drive circuit unit and the gate line G2. The other gate drive circuit unit of this gate drive circuit is connected by the means of the second stage gate drive circuit unit, and the signal output terminal of the n-th stage gate drive circuit unit is connected to the signal input terminal of the (n+1)-th stage gate drive circuit unit and the gate line Gn.

Each of the gate drive circuit units is connected to the first clock signal terminal CLKB and the second clock signal terminal CLK. As shown in FIG. 5, the clock signal terminals connected to each gate drive circuit unit are provided with clock signals from clock signals clock1 and clock2 of two systems, where the potential of clock1 is opposite to that of clock2, and clock1 and clock2 are clock signals with a duty cycle of 50%. The second clock signal terminal CLK of the first stage gate drive circuit unit inputs clock2, the first clock signal terminal CLKB inputs clock2, the second clock signal terminal CLK of the second stage gate drive circuit unit inputs clock2, the first clock signal terminal CLKB inputs clock1; for the n-th stage gate drive circuit unit, when n is an odd number, the second clock signal terminal of the n-th stage gate drive circuit unit inputs clock1, and the first clock signal CLKB inputs clock2; when n is an even number, the second clock signal terminal of the n-th stage gate drive circuit unit inputs clock2, and the first clock signal CLKB inputs clock1; and FIG. 5 is an example in which n is an even number.

Figure 6:
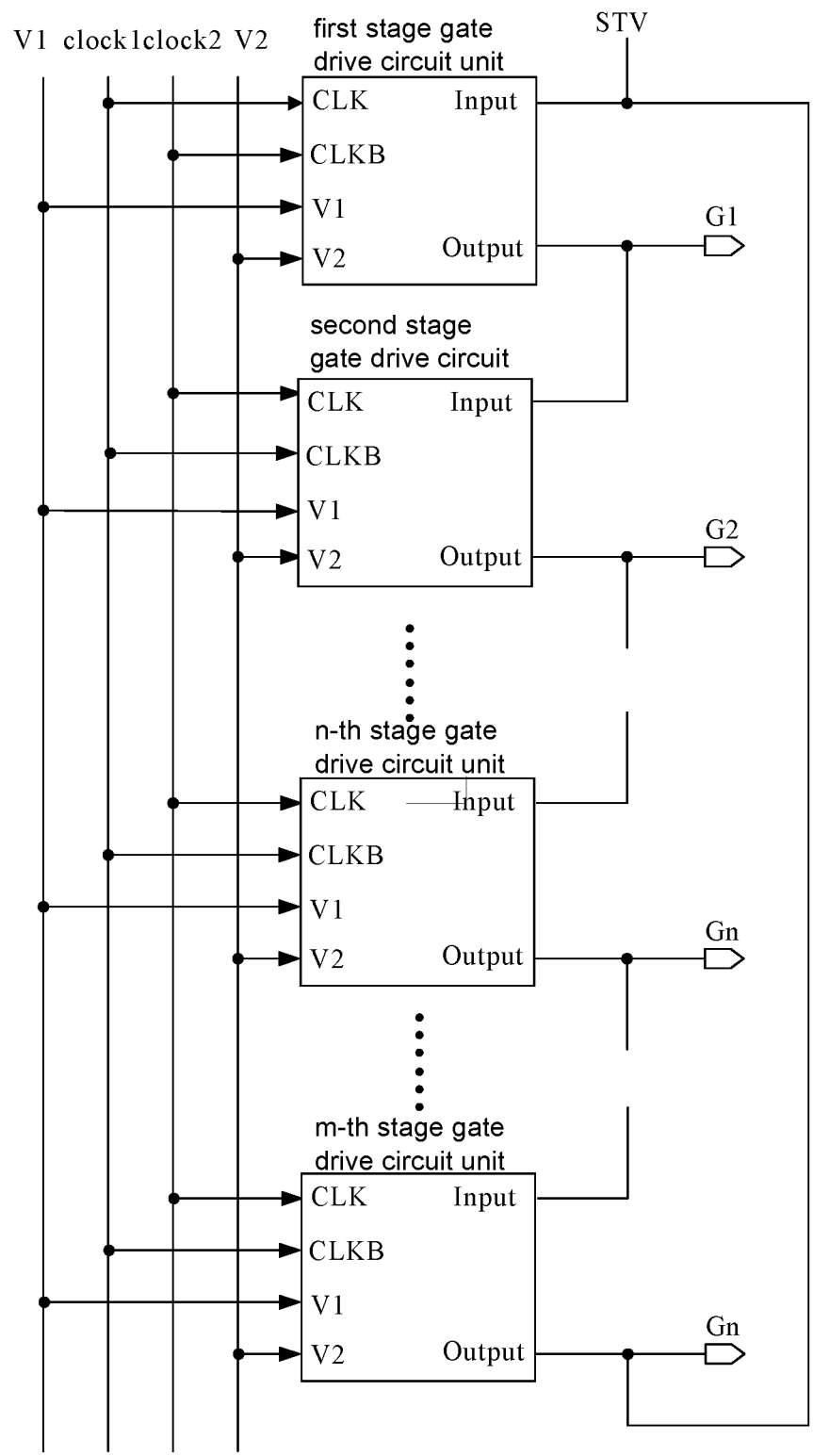
FIG. 6 is a schematic structure diagram of the improved gate drive circuit shown in FIG. 5.

As shown in FIG. 6, in an improvement of the embodiment of the present disclosure, at least two cascaded gate drive circuit units include gate drive circuit units from a first stage to an m-th stage, m is an integer greater than or equal to n; the signal input terminal of the m-th stage gate drive circuit unit is connected to the signal output terminal of the (m−1)-th stage gate drive circuit unit, and the signal output terminal of the m-th stage gate drive circuit unit is connected to the signal input terminal of the first stage gate drive circuit unit.

That is, when the gate drive circuit shown in FIG. 5 is initially started, a signal is input from the frame start signal terminal STV to the signal input terminal of the first stage gate drive circuit unit, and the operation is performed after the gate drive circuit is started. In the process, a signal is input from the signal input terminal of the m-th stage gate drive circuit unit to the signal input terminal of the first stage gate drive circuit unit.

According to the introduction of the gate drive unit circuit unit provided by the embodiment of the present disclosure, it is known that the gate drive circuit containing the aforesaid gate drive circuit unit provided by the embodiment of the present disclosure can realize the self-resetting of the present stage gate drive circuit unit without the output of the next stage gate drive circuit unit, reducing the interaction of the two-stage gate drive circuit unit and thus improving the fault tolerance of the gate drive circuit.

Figure 7:
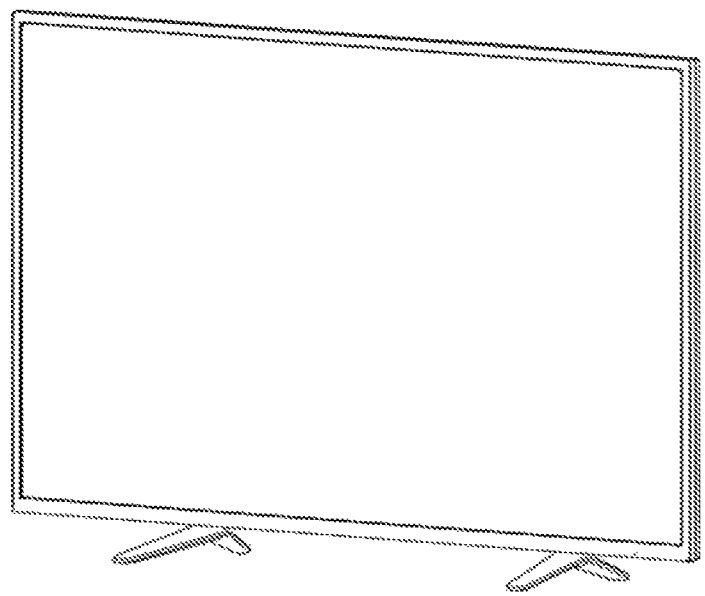
FIG. 7 is a schematic structure diagram of display device provided by an embodiment of the present disclosure.

As shown in FIG. 7, an embodiment of the present disclosure also provides a display device 701 including a gate drive circuit provided in the above embodiment.

In addition, the display device may be any product or component having a display function as follows: a liquid crystal panel, an electronic paper, an OLED panel, a mobile phone, a tablet computer, a television set, a monitor, a notebook computer, a digital photo frame, a navigator, or the like.

As described above, only the specific embodiments of the present disclosure are disclosed, but the scope of the present disclosure is not limited thereto. Those skilled in the art will easily think of that within the technical scope disclosed in the present disclosure, variations or replacement be covered within the scope of the present disclosure. Accordingly, the scope of protection of the present disclosure is subject to the scope of protection of the claims.

Additional embodiments including any one of the embodiments described above may be provided by the disclosure, where one or more of its components, functionalities or structures is interchanged with, replaced by or augmented by one or more of the components, functionalities or structures of a different embodiment described above.

What is claimed is:

1. A gate drive circuit unit, comprising:
an input sub-circuit, connected to a first level terminal, a signal input terminal and a first node, and used for pulling a voltage at the first node as same as a voltage at the first level terminal under control of an input signal at the signal input terminal;
a control sub-circuit, connected to the first level terminal, a second level terminal, a first clock signal terminal, a signal output terminal and a second node, and used for pulling a voltage at the second node as the same as a voltage at the first level terminal under the control of a first clock signal at the first clock signal terminal, an input signal at the signal input terminal and an output signal at the signal output terminal, or pulling a voltage at the second node as the same as a voltage at the second node under the control of an input signal at the signal input terminal and an output signal at the signal output terminal;
an energy storage sub-circuit, connected to the first node and the signal output terminal, and used for storing the voltage at the first node and causing the voltage at the first node and the voltage at the signal output terminal to equipotentially jump;
a reset sub-circuit, connected to the signal output terminal, the first node, the second node and the second level terminal, and used for pulling the voltage at the first node as the same as the voltage at the second level terminal and pulling the voltage at the signal output terminal as the same as the voltage at the second level terminal under the control of the voltage at the second node; and
an output sub-circuit, connected to the first node, the signal output terminal, and a second clock signal terminal, and used for outputting a second clock signal of a second clock signal terminal at the signal output terminal under the control of the voltage at the first node.

2. The gate drive circuit unit according to claim 1, wherein, the input sub-circuit comprises:
a first transistor, a first end and a gate of which are connected to the first level terminal, and a second end of which is connected to a first end of a second transistor; and
the second transistor, a second end of which is connected to the first node, and gate of which is connected to the signal input terminal.

3. The gate drive circuit unit according to claim 2, wherein, both the first transistor and the second transistor are N-type transistors or both P-type transistors.

4. The gate drive circuit unit according to claim 1, wherein, the control sub-circuit comprises:
a third transistor, a first end of which is connected to the first level terminal, a second end of which is connected to the second node, and a gate of which is connected to the first clock signal terminal;
a fourth transistor, a first end of which is connected to the second node, a second end of which is connected to the second level terminal, and a gate of which is connected to the signal output terminal;
a fifth transistor, a first end of which is connected to the second node, a second end of which is connected to the second level terminal, and a gate of which is connected to the signal output terminal; and
a first capacitor, a first end of which is connected to the second node, and a second end of which is connected to the second level terminal.

5. The gate drive circuit unit according to claim 1, wherein, the energy storage sub-circuit comprises a second capacitor, a first pole of which is connected to the first node, and a second pole of which is connected to the signal output terminal.

6. The gate drive circuit unit according to claim 1, wherein, the reset sub-circuit comprises:
a sixth transistor, a first end of which is connected to the first node, a second end of which is connected to the second level terminal, and a gate of which is connected to the second node; and
a seventh transistor, a first end of which is connected to the signal output terminal, a second end of which is connected to the second level terminal, and a gate of which is connected to the second node.

7. The gate drive circuit unit according to claim 1, wherein, the output sub-circuit comprises an eighth transistor, a first end of which is connected to the second clock signal terminal, a second end of which is connected to the signal output terminal, and a gate of which is connected to the first node.

8. The gate drive circuit unit according to claim 7, wherein the output sub-circuit further comprises a ninth transistor, a first end of which is connected to the second clock signal terminal, a second end and a gate of which are connected to the signal output terminal.

9. A driving method of a gate drive circuit unit for driving the gate drive circuit unit according to claim 1, wherein, the method comprising:
a first phase, pulling, by an input sub-circuit, a voltage at a first node as the same as a voltage at a first level terminal under the control of an input signal at a signal input terminal, and pulling, by a control sub-circuit, a voltage at a second node as the same as a voltage at a second level terminal under the control of the input signal at the signal input terminal and an output signal at a signal output terminal;
a second phase, outputting, by an output sub-circuit, a second clock signal of a second clock signal terminal at the signal output terminal under the control of the voltage at the first node; pulling, by the control sub-circuit, the voltage at the second node as the same as the voltage at the second level terminal under the control of the input signal at the signal input terminal and the output signal at the signal output terminal; and causing, by an energy storage sub-circuit, the voltage at the first node and the voltage at the signal output terminal to equipotentially jump;
a third phase, pulling, by the control sub-circuit, a voltage at the second node as the same as a voltage at the first level terminal under the control of a first clock signal at the first clock signal terminal, an input signal at the signal input terminal and an output signal at the signal output terminal; and pulling, by a reset sub-circuit, the voltage at the first node as the same as the voltage at the second level terminal and the voltage at the signal output terminal as the same as the voltage at the second level terminal under the control of the voltage at the second node.

10. A gate drive circuit, comprising at least two cascaded gate drive circuit units according to claim 1, a signal input terminal of a first stage gate drive circuit unit is connected to a frame start signal terminal STV, and a signal output terminal of the first stage gate drive circuit unit is connected to a signal input terminal of a second stage gate drive circuit unit;

a signal input terminal of an n-th stage gate drive circuit unit is connected to a signal output terminal of an (n−1)-th stage gate drive circuit unit, and a signal output terminal of the n stage gate drive circuit unit is connected to a signal input terminal of an (n+1)-th stage gate drive circuit unit, wherein, n is an integer greater than 1.

11. The gate drive circuit according to claim 10, wherein, the at least two cascaded gate drive circuit units comprise gate drive circuit units from a first stage to an m-th stage, where m is an integer greater than or equal to n; and, a signal input terminal of an m-th stage gate drive circuit unit is connected to a signal output terminal of an (m−1)-th stage gate drive circuit unit, and a signal output terminal of the m-th stage gate drive circuit unit is connected to a signal input terminal of the first stage gate drive circuit unit.

12. A display device comprising the gate drive circuit according to claim 10.

* * * * *